(12) United States Patent
Koba et al.

(10) Patent No.: US 7,620,838 B2
(45) Date of Patent: Nov. 17, 2009

(54) SEMICONDUCTOR INTEGRATED CIRCUIT AND IMAGE PROCESSING SYSTEM USING THE SAME

(75) Inventors: Takashi Koba, Kodaira (JP); Naoyuki Anan, Ome (JP); Mikiko Sakai, Ome (JP); Seryung Park, Akishima (JP); Keiichi Higeta, Hamura (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 370 days.

(21) Appl. No.: 11/251,838

(22) Filed: Oct. 18, 2005

(65) Prior Publication Data

US 2006/0085661 A1 Apr. 20, 2006

(30) Foreign Application Priority Data

Oct. 19, 2004 (JP) .............................. 2004-303648

(51) Int. Cl.
G06F 1/00 (2006.01)
(52) U.S. Cl. ...................................... 713/501; 711/169
(58) Field of Classification Search ................. 713/501; 365/233; 711/169
See application file for complete search history.

(56) References Cited

U.S. PATENT DOCUMENTS

| | | | |
|---|---|---|---|
| 5,083,296 A * | 1/1992 | Hara et al. ............. | 365/230.02 |
| 5,287,327 A * | 2/1994 | Takasugi ............... | 365/230.02 |
| 5,359,564 A | 10/1994 | Liu et al. | |
| 6,304,511 B1 * | 10/2001 | Gans et al. ............. | 365/233.14 |
| 6,356,508 B1 * | 3/2002 | Yoshimoto ............. | 365/233.1 |
| 6,442,103 B1 * | 8/2002 | Kwak et al. ............ | 365/233.16 |
| 6,593,959 B1 * | 7/2003 | Kim et al. .............. | 348/57 |
| 6,731,526 B2 | 5/2004 | Inoue | |
| 6,735,101 B2 | 5/2004 | Aikawa | |
| 6,944,039 B1 * | 9/2005 | Nataraj et al. ......... | 365/49.17 |
| 2002/0021152 A1 * | 2/2002 | Goto et al. ............. | 327/156 |
| 2003/0016389 A1 * | 1/2003 | Miyaguchi et al. ..... | 358/1.16 |
| 2006/0120207 A1 * | 6/2006 | Lee ....................... | 365/233 |

FOREIGN PATENT DOCUMENTS

| | | |
|---|---|---|
| JP | 06-349284 | 12/1994 |
| JP | 2003-272386 | 9/2003 |
| JP | 2003-303495 | 10/2003 |

OTHER PUBLICATIONS

Office Action in Japanese Application No. 2004-303648, dispatched Apr. 21, 2009.

* cited by examiner

*Primary Examiner*—Chun Cao
*Assistant Examiner*—Vincent T Tran
(74) *Attorney, Agent, or Firm*—Brundidge & Stanger, P.C.

(57) ABSTRACT

A circuit system is provided capable of improving the throughput thereof by eliminating the operational constraint that if the operating frequency of a content addressable memory is lower than the operating frequency of a system LSI, two system clocks should be provided, or the higher frequency should be synchronized with the slower system clock. A clock control circuit (103) for down-converting an internal clock ($\Phi 1$) of a LSI (101) is provided, and a control signal whose frequency is made lower is used to operate a content addressable memory circuit (102).

10 Claims, 10 Drawing Sheets

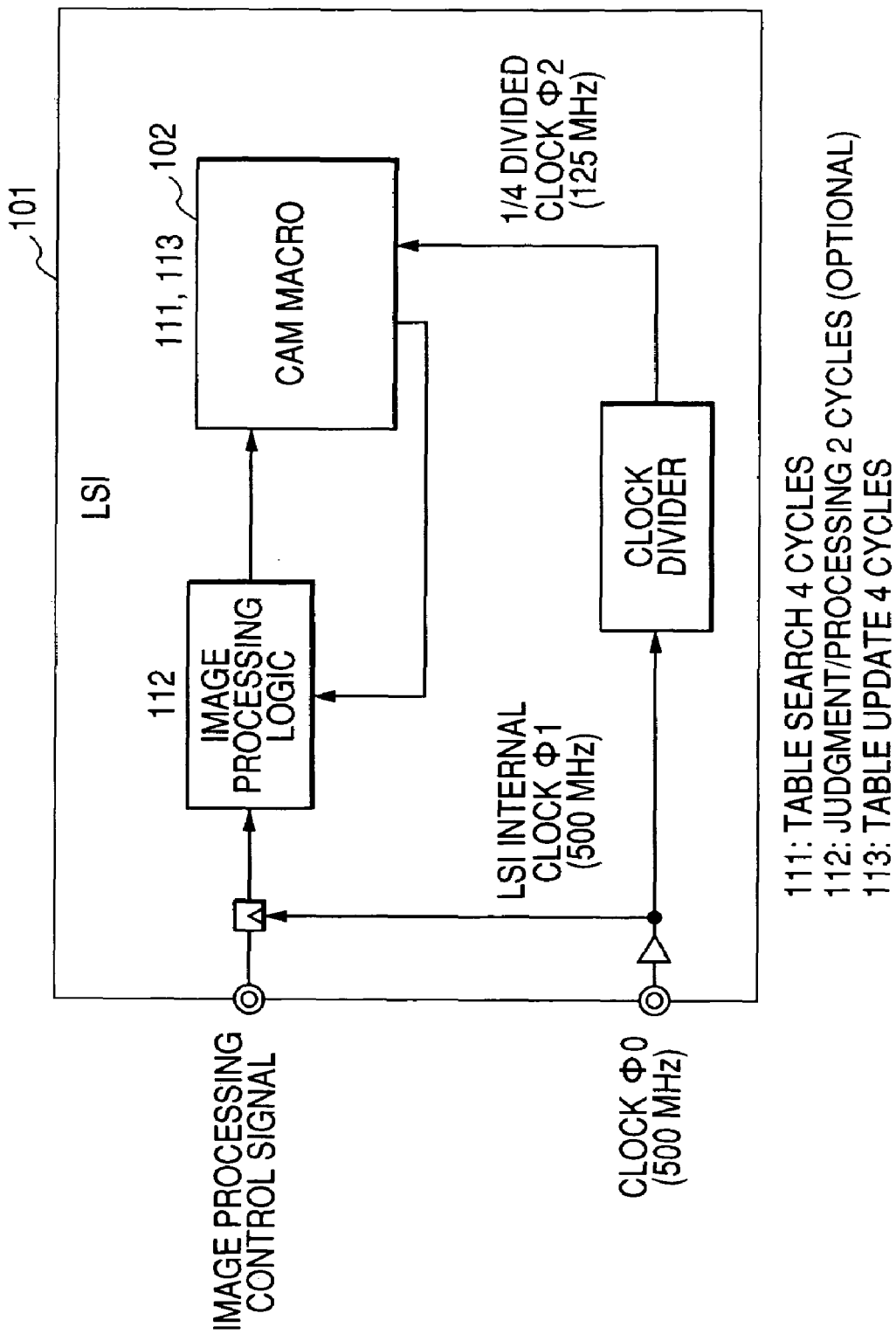

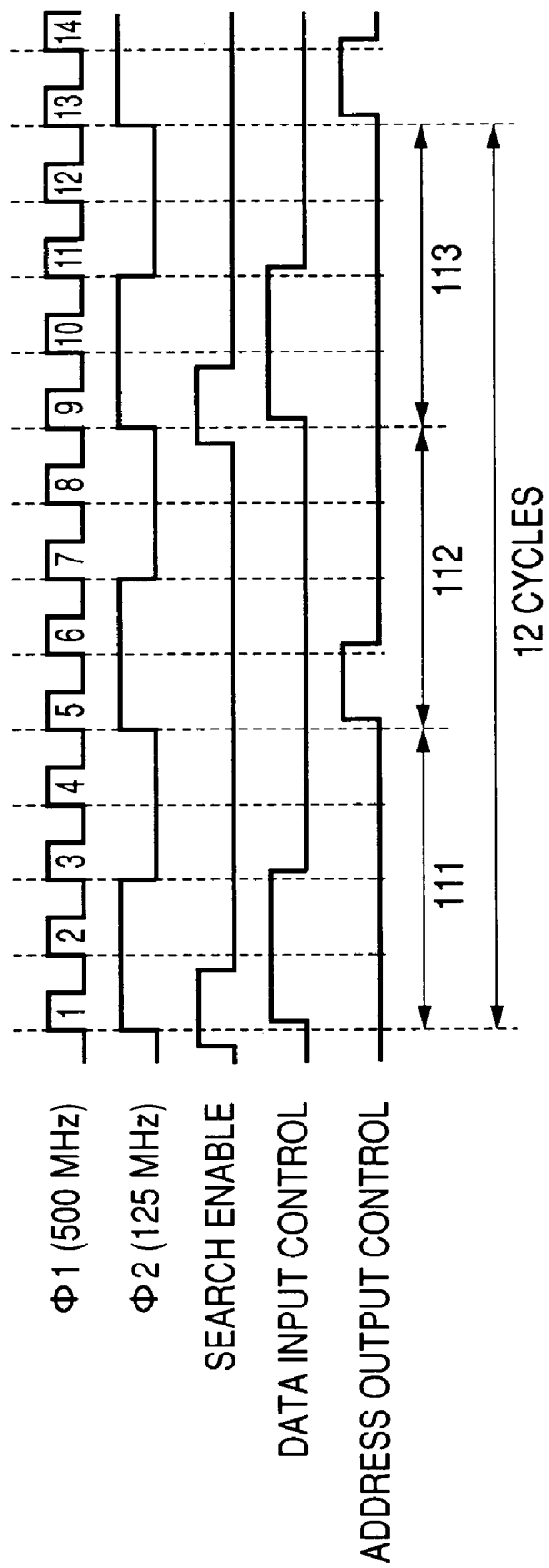

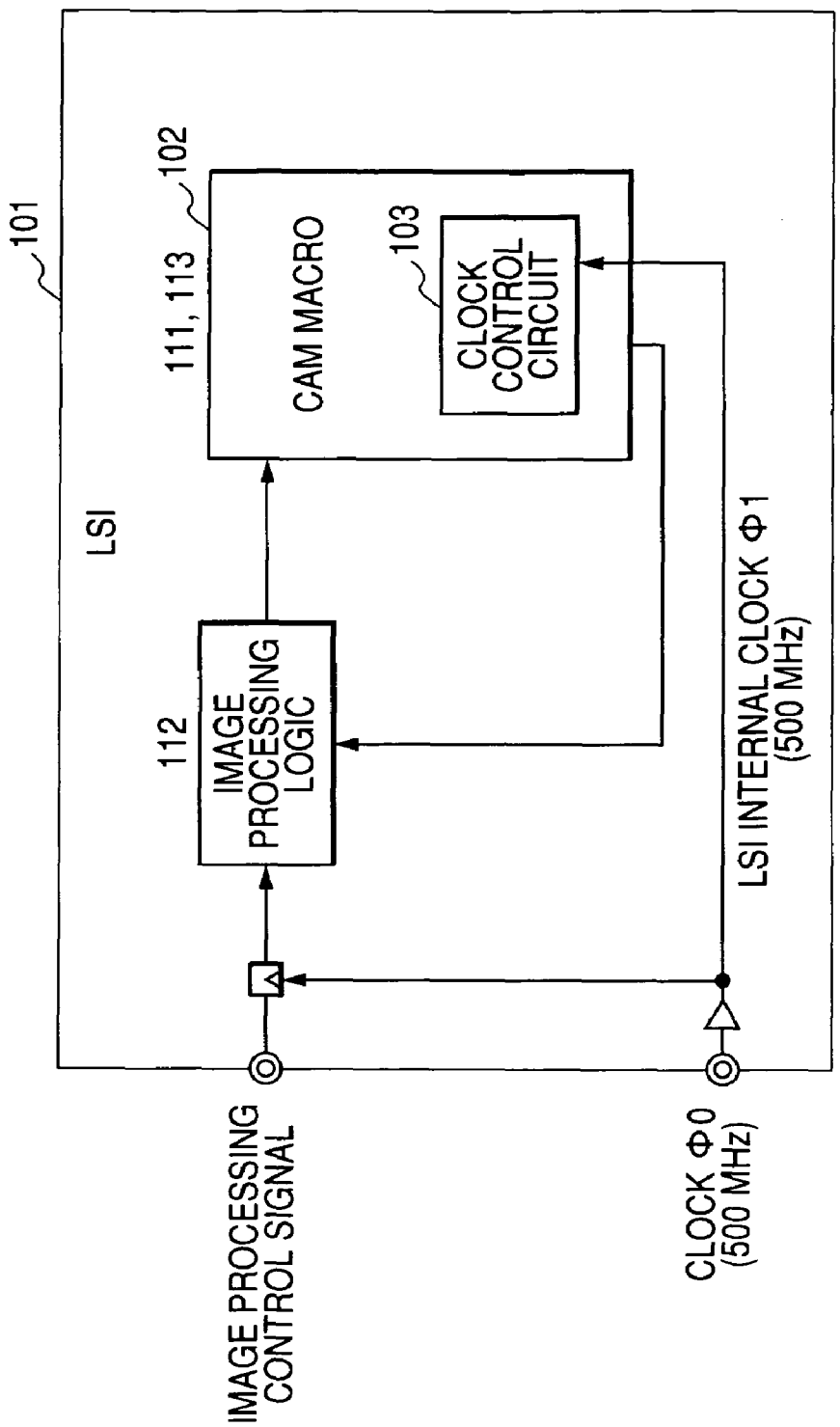

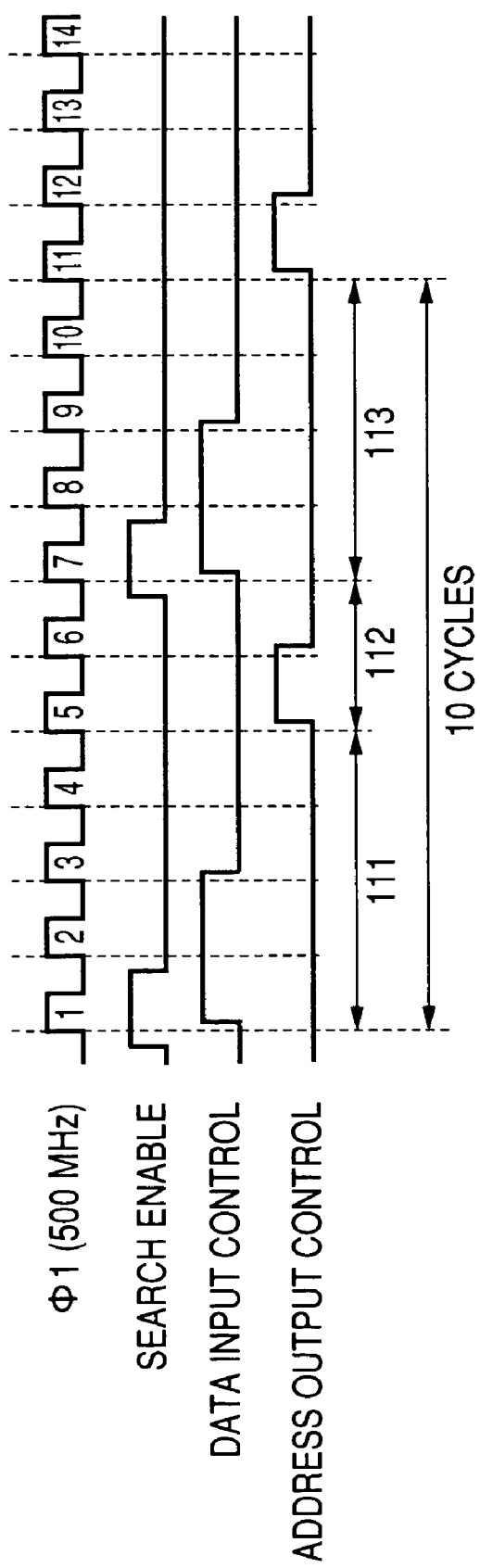

US 7,620,838 B2

SEMICONDUCTOR INTEGRATED CIRCUIT AND IMAGE PROCESSING SYSTEM USING THE SAME

CLAIM OF PRIORITY

The present application claims priority from Japanese application JP2004-303648, filed on Oct. 19, 2004, the content of which is hereby incorporated by reference into this application.

BACKGROUND OF THE INVENTION

1. Field of the Invention

The present invention relates to semiconductor integrated circuits, and more particularly to a circuit for converting (down-converting) a frequency of a system clock (high-speed internal clock of LSI) to a lower frequency to control a storage circuit (more specifically, a content addressable memory (CAM) circuit). In addition, it relates to an image processing system using the same.

2. Description of the Related Arts

Heretofore, system LSIs (large-scale semiconductor integrated circuits) each having a built-in content addressable memory have been provided. One of such system LSIs is configured to generate a CAM control timing signal from a system clock. (For example, refer to Japanese Published Patent Application No. 6-349284).

SUMMARY OF THE INVENTION

Heretofore, since the frequency of a system clock has been at the same level as the internal operating frequency of a content addressable memory (about from 125 to 250 MHz), it has been possible to control input/output signals of the content addressable memory by use of the system clock without causing problems.

However, in recent years, the frequency of a system clock is made higher (500 MHz) with the objective of improving the throughout and performance. On the other hand, a search control signal should be still kept at 125 MHz to cope with the internal operating frequency of the content addressable memory (about 125 to 250 MHz. Because the operating frequency of the content addressable memory largely depends on an electric current of a memory cell, it is not easy to speed up the operating frequency in question relative to surrounding logic parts.

In the configuration disclosed in FIG. 2 of Japanese Patent Laid-open No. 6-349284 described above, if a system clock is speeded up, it becomes impossible to load a coincidence line node (24) into a latch circuit (22) by a clock signal (26). This is because a response to the fall time of the coincidence line node (24) is slow, making it impossible to follow the system clock.

FIG. 5 is a diagram illustrating a configuration of an image processing LSI considered by the inventor himself prior to the proposal of the present invention. FIG. 6 illustrates a timing charge of the image processing LSI. A LSI clock Φ1 whose frequency is 500 MHz is divided into four to generate a clock Φ2 whose frequency is 125 MHz. A CAM macro is controlled by use of the clock F2. The table search (111) is started on the rising edge of the clock Φ1 (1). At this time, a SEARCH enable signal for controlling the CAM macro is loaded by use of the divided clock. On the rising edge of the clock Φ1 (5), more specifically, on the rising edge of the second cycle of the divided clock, an address output control signal is generated. The judgment/processing (112) are started at this point of time. Although the judgment/processing (112) ends in two cycles, the next control of the CAM macro can be started on the rising edge of the clock Φ1 (9), more specifically, on the rising edge of the third cycle of the divided clock. Here, the SEARCH enable signal is inputted again to perform table update (113). As a result, the number of cycles required for the search processing becomes 12 cycles. In this configuration, because the system clock is simply divided into four to use the divided clock as the internal clock, the internal clock is subject to constraints by the system clock. As a result, for example, in a case where the number of cycles required for the processing from the table search to the table update is given by a request from the system side, the number of times of obtaining enable signals per unit cycle cannot be sufficiently achieved. This poses a problem in that it is not possible to sufficiently achieve the speedup.

A typical example of the present invention will be described below.

To be more specific, according to one aspect of the present invention, there is provided a semiconductor integrated circuit comprising: a content addressable memory circuit; and a control circuit for, if an operating frequency of a control signal for controlling input/output signals of the content addressable memory circuit differs from an operating frequency of a LSI internal clock, adjusting the timing thereof.

According to the means described above, in the semiconductor integrated circuit that operates with a high-speed system clock, it is possible to achieve the speedup without constraints by the system clock by controlling the content addressable memory circuit that operates at a lower speed, using the clock that is down-converted by the control circuit for adjusting the timing.

One of the typical effects of the present invention including the above means is an improvement in throughput and performance.

BRIEF DESCRIPTION OF THE DRAWINGS

FIG. 5 is a block diagram schematically illustrating a configuration of an image processing LSI to be controlled with a divided clock;

FIG. 6 is a timing chart of FIG. 5;

FIG. 7 is a block diagram schematically illustrating a configuration of an image processing LSI to which the present invention is applied, and which uses a clock control circuit; and FIG. 8 is a timing chart of FIG. 7.

DETAILED DESCRIPTION OF THE PREFERRED EMBODIMENTS

Preferred embodiments of the present invention will be described in detail with reference to drawings below.

First Embodiment

Figure 1:
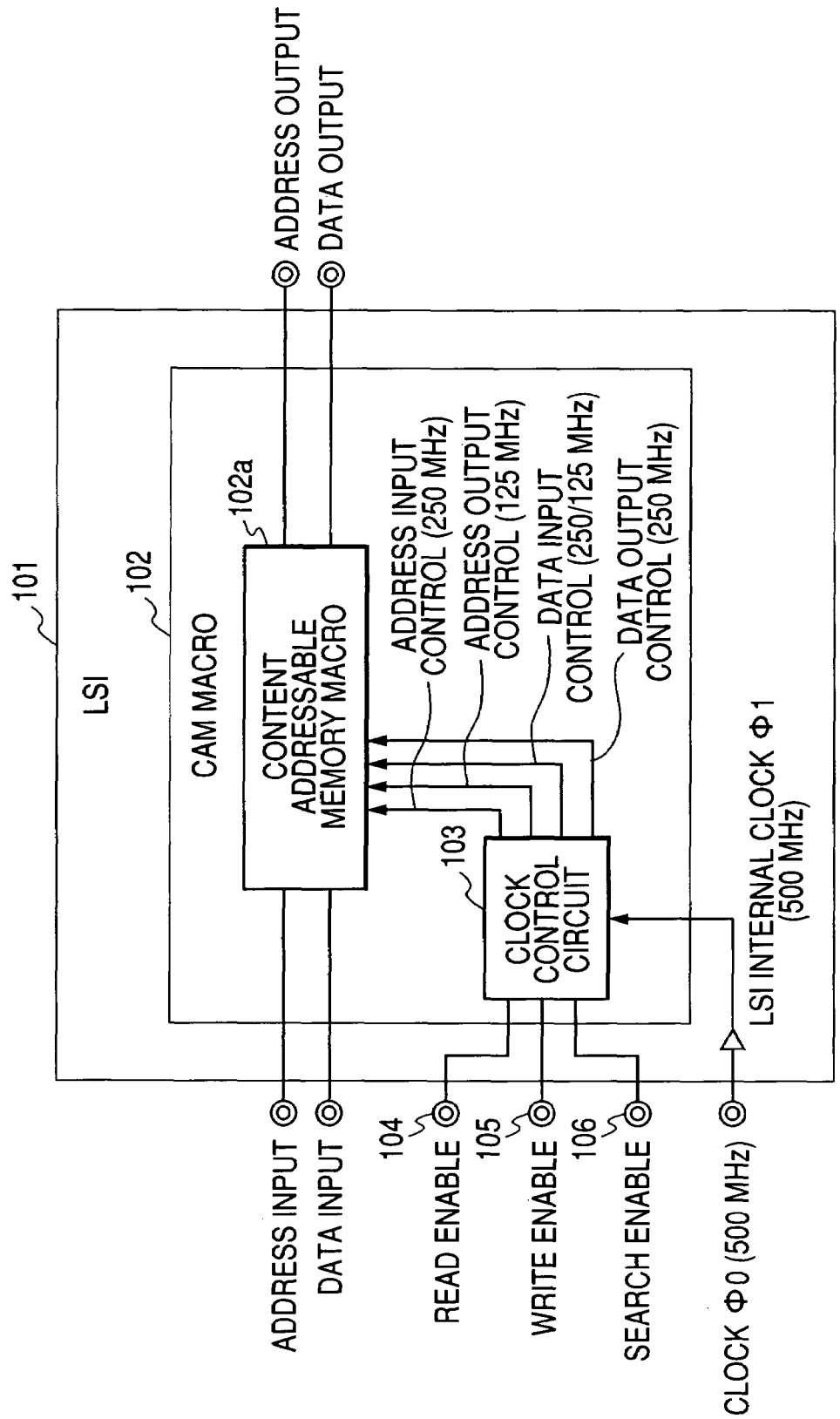
FIG. 1 is a diagram illustrating a configuration of a system LSI to which the present invention is applied.

FIG. 1 illustrates a system LSI according to a first embodiment, which is an example of a semiconductor integrated circuit device to which the present invention is applied. One CAM macro 102 is placed on the system LSI 101 on which a clock control circuit according to this embodiment is placed. This embodiment is applied to, for example, LSIs for image processing.

In FIG. 1, reference numeral 103 denotes a clock control circuit for controlling a content addressable memory macro 102a. The clock control circuit 103 is built into the CAM macro 102. This configuration produces effects of reducing man-hours required for mounting on LSI, and also facilitating the timing alignment between the content addressable memory macro 102a and the clock control circuit 103. Signals inputted from external pins clock $\Phi 0$, 104, 105, 106 are connected to the clock control circuit 103. A buffer may also be added between each of the external pins and the clock control circuit 103. The clock control circuit 103 receives signals from the external pins 104, 105, 106 in synchronization with the clock $\Phi 1$ so as to generate a control signal for controlling the content addressable memory macro 102a. In this case, a frequency of the generated signal is converted from a frequency (500 MHz) of LSI internal clock $\Phi 1$ to a lower frequency (250 MHz/125 MHz). Each signal of address input control, data input control, address output control, and data output control is directed from the clock control circuit 103 to the content addressable memory macro 102a. Further, an address input pin, an address output pin, a data input pin, and a data output pin are connected to the content addressable memory macro 102a.

Figure 4:
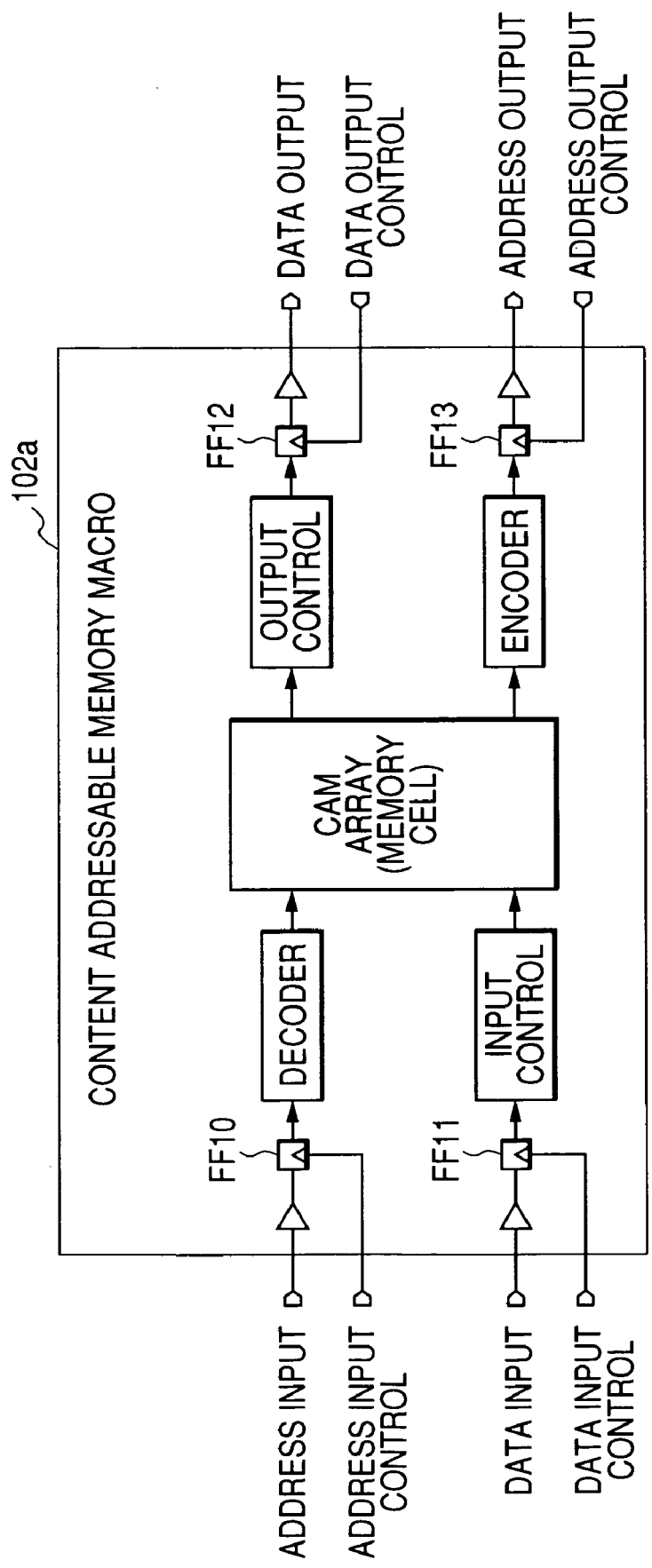
FIG. 4 is a diagram illustrating a configuration of a content addressable memory macro shown in FIG. 1.

FIG. 4 is a diagram illustrating a configuration of the content addressable memory macro 102a. An address input end is connected to a FF10 through a buffer. The FF10 is controlled by address input control; and an output end of the FF10 is connected to a decoder circuit. A data input end is connected to a FF11 through a buffer. The FF11 is controlled by data input control; and an output end of the FF11 is connected to an input control circuit. The decoder circuit and the input control circuit are connected to a CAM array. The CAM array is connected to an output control circuit and an encoder circuit. An output end of the output control circuit is connected to a FF12; and the FF12 is controlled by data output control. An output of the FF12 is output through a buffer to data output. An output end of the encoder circuit is connected to a FF13; and the FF13 is controlled by address output control. An output of the FF13 is output through a buffer to address output.

Next, operation will be specifically described. In the case of read operation, when an address is inputted, the address is loaded into the FF10 by an address input control signal. From the loaded address, the decoder generates a signal used to select a desired memory cell of the CAM array. Next, the output control circuit reads out information stored in the selected memory cell. The information is then loaded into the FF12 by a data output control signal. The data loaded into the FF12 is output from the data output.

In the case of write operation, an address is loaded in a manner similar to that of the read operation. Write data is loaded in parallel with the loading of the address. The write data is inputted from the data input end, and is then loaded into the FF11 by a data input control signal. Through the input control circuit, the data is written to a memory cell selected by the address input.

In the case of search operation, inputted search data is compared with information stored in the CAM array. The search data is inputted from the data input end, and is then loaded into the FF11 by a data input control signal. The loaded data is transferred through the input control circuit to the CAM array. The transferred search data is compared with all pieces of information stored in the CAM array. The result of comparison is inputted into the encoder circuit. After that, the result of encoding is loaded into the FF13 by an address output control signal, and is then output as an address output.

Figure 3:
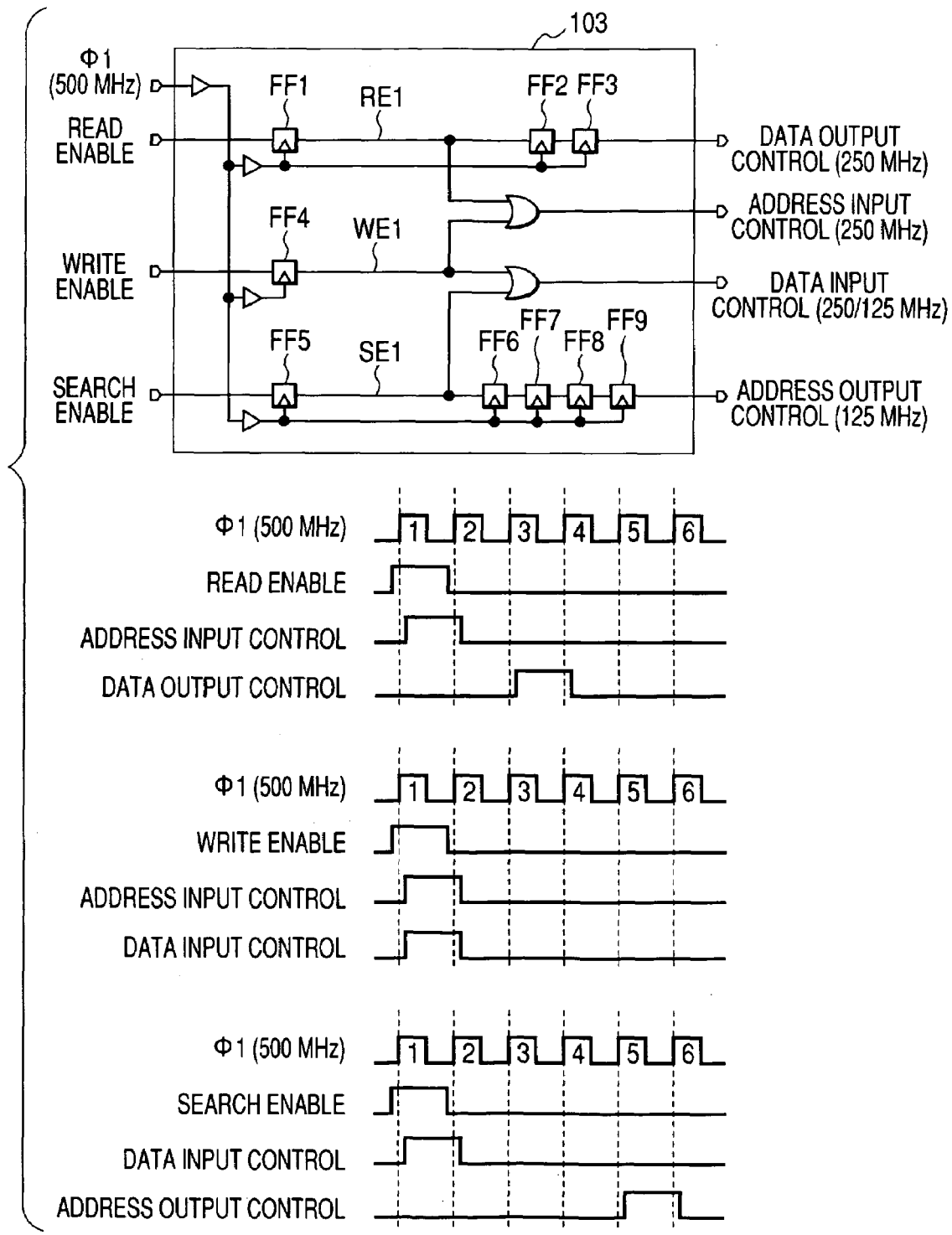
FIG. 3 is a diagram illustrating as an example a configuration of a clock control circuit shown in FIG. 1.

FIG. 3 is a configuration diagram illustrating as an example a configuration of the clock control circuit 103. Input signals include a READ enable signal, a WRITE enable signal, a SEARCH enable signal, and a clock $\Phi 1$. Output signals include an address input control signal, an address output control signal, a data input control signal, and a data output control signal. Flip-flops FF1, FF2, FF3 are serially connected between the READ enable signal end and the data output control signal end. A flip-flop FF4 is connected to the WRITE enable signal end. Flip-flops FF5, FF6, FF7, FF8, FF9 are serially connected between the SEARCH enable signal end and the address output control signal end. A signal that is obtained by ORing RE1 with WE1 is equivalent to the address input control signal. A signal that is obtained by ORing WE1 with SE1 is equivalent to the data input control signal.

The operation performed when each of the enable signals is inputted will be specifically described below. In principle, exclusive control must be performed for each enable signal. When it is inputted, the READ enable signal is loaded into the FF1 by the clock $\Phi 1$. The READ enable signal is usually kept in a "0" state. At the time of read operation, "1" is inputted. A period of time during which "1" is inputted corresponds to a length of time during which the FF1 is allowed to input using one cycle of the clock $\Phi 1$. In addition, the read operation, which is performed at a frequency of 250 MHz, is performed by inputting the data output control to the content addressable memory macro 102a, at intervals of at least two cycles of the clock $\Phi 1$ after the read enable signal is inputted to the clock control circuit 103. An output signal RE1 of the FF1 becomes a signal having a width of about 200 ps, which is calculated from the frequency of the clock $\Phi 1$ (500 MHz). The output signal RE1 is then output as an address input control signal. Moreover, the output signal RE1 is successively loaded into the flip-flops FF2, FF3 that are serially connected to each other. Then, the output signal RE1 is output as the data output control signal after a lapse of two cycles from the rising edge of the address input control signal. This signal also has a width of about 200 ps.

When the WRITE enable signal is inputted, the WRITE enable signal is loaded into the flip-flop FF4 by the clock $\Phi 1$. The WRITE enable signal is usually kept in the "0" state. At the time of write operation, "1" is inputted. A period of time during which "1" is inputted corresponds to a length of time during the FF4 is allowed to input using one cycle of the clock $\Phi 1$. In addition, the write operation, which is performed at a frequency of 125/250 MHz, is performed by inputting the data input control to the content addressable memory macro 102a, slightly later than the timing when the WRITE enable signal is inputted to the clock control circuit 103. An output signal WE1 of the FF4 becomes a signal having a width of about 200 ps, which is calculated from the frequency of the clock $\Phi 1$ (500 MHz). The output signal WE1 is then output as an address input control signal and a data input control signal.

When it is inputted, the SEARCH enable signal is loaded into the flip-flop FF5 by the clock F1. The SEARCH enable signal is usually kept in the "0" state. At the time of search operation, "1" is inputted. A period of time during which "1" is inputted corresponds to a length of time during which the FF5 is allowed to input using one cycle of the clock $\Phi 1$. In addition, the search operation, which is performed at a frequency of 125 MHz, is performed by inputting the address output control to the content addressable memory macro 102a, at intervals of at least four cycles of the clock Φ1 after the SEARCH enable signal is inputted to the clock control circuit 103. An output signal SE1 of the FF5 becomes a signal having a width of about 200 ps, which is calculated from the frequency of the clock Φ1 (500 MHz). The output signal SE1 is then output as a data input control signal. Moreover, the output signal SE1 is successively loaded into the flip-flops FF6, FF7, FF8, FF9 that are serially connected to each other. Then, the output signal SE1 is output as the address output control signal after a lapse of four cycles from the rising edge of the data input control signal. This signal also has a width of about 200 ps.

The clock control circuit 103 ensures the desired timing of each control signal by serially connecting the flip-flops (FF). In this method, centralizing locations at which the flip-flops are placed makes it possible to ensure the desired timing relatively easily. Additionally, even if the operating frequency of a storage circuit to be controlled is changed, it is possible to easily cope with the change by adjusting the number of stages of flip-flops to be serially connected. Moreover, each control signal is a control signal used to control the loading into the flip-flops. Accordingly, it is necessary to ensure the setup time and the hold time that enable the loading. An adjustment circuit for ensuring the setup time and the hold time is obtained by inserting a delay circuit thereto. The delay circuit may be configured with the even number of inverter circuits that are serially connected to each other.

FIG. 7 is a diagram schematically illustrating a configuration of an image processing LSI that is controlled by the clock control circuit. The LSI 101 includes a CAM macro 102, and an image processing logic for controlling the CAM macro 102. In addition, the LSI 102 includes a built-in clock control circuit 103. The clock control circuit 103 and the image processing logic are controlled by an internal clock Φ1. Next, a control example in which a CAM macro of an image processing system is used will be described. First of all, table search (111) is performed in four cycles by use of the CAM macro, and then the result of the table search is judged/processed (112) in the image processing logic. Further, table update (113) is performed in four cycles by use of the CAM macro. It is to be noted that although the judgment/processing are performed at least in two cycles, the number of cycles can be arbitrarily increased depending on a kind of system.

FIG. 8 is a time chart illustrating signals observed when the clock control circuit included in the LSI shown in FIG. 7 is used. The table search (111) is started on the rising edge of the clock Φ1 (1). At this time, a SEARCH enable signal for controlling the CAM macro is inputted on the rising edge of the clock Φ1 (1). Next, in response to the rising (5) of the clock Φ1, an address output control signal is generated. The judgment/processing (112) are started at this point of time. The judgment/processing (112) end in two cycles. Accordingly, on the rising edge of the clock Φ1 (7), a SEARCH enable signal is inputted to start the table update (113). As a result, the number of cycles required for the search processing becomes 10 cycles. Accordingly, as compared with the method shown in FIG. 5, it is possible to decrease the number of cycles by two cycles, which enables an improvement in throughput.

Second Embodiment

Figure 2:
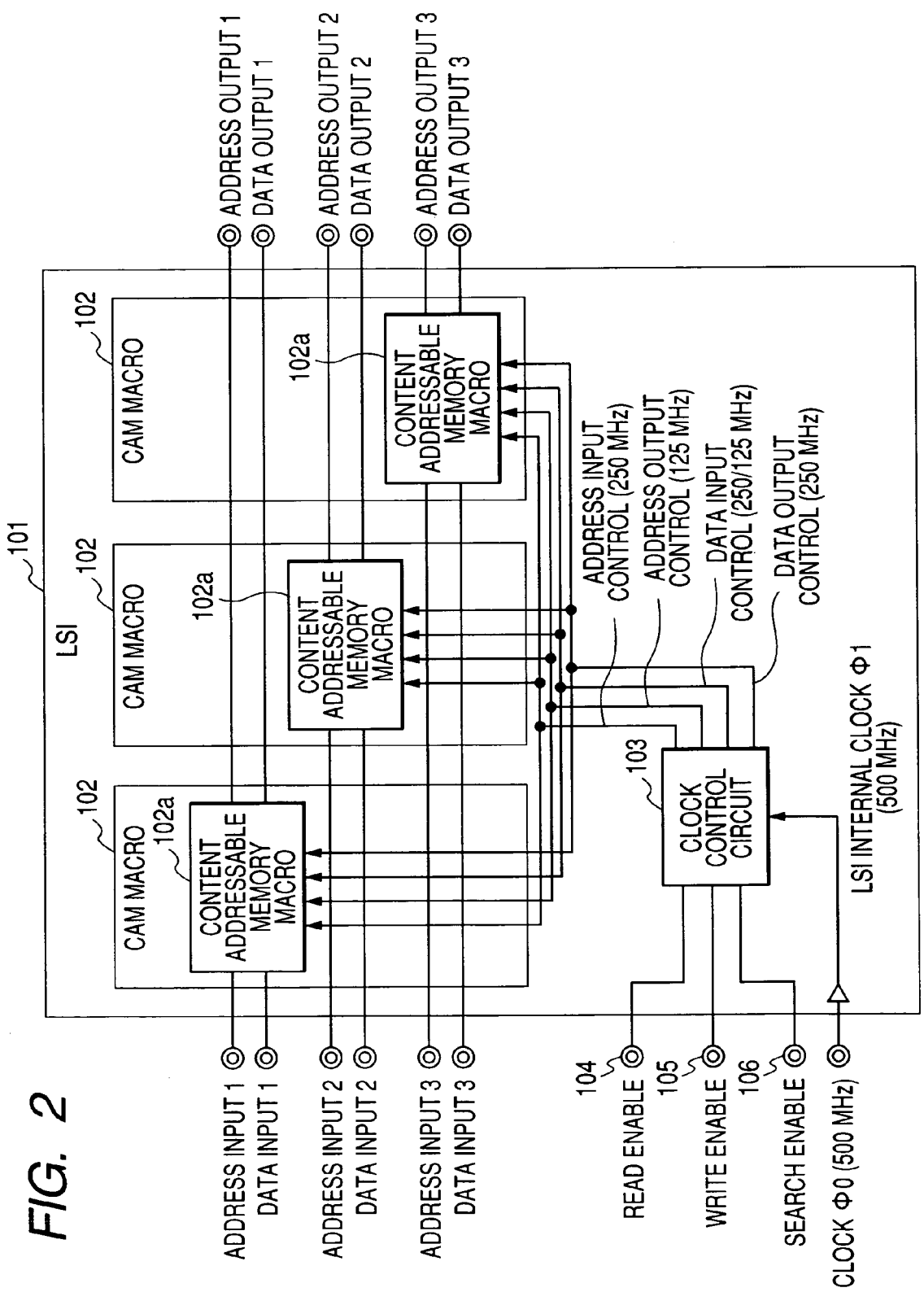
FIGS. 2a and 2b are diagrams illustrating configurations of system LSIs in which a plurality of content addressable memory macros are controlled.
Figure 2A:
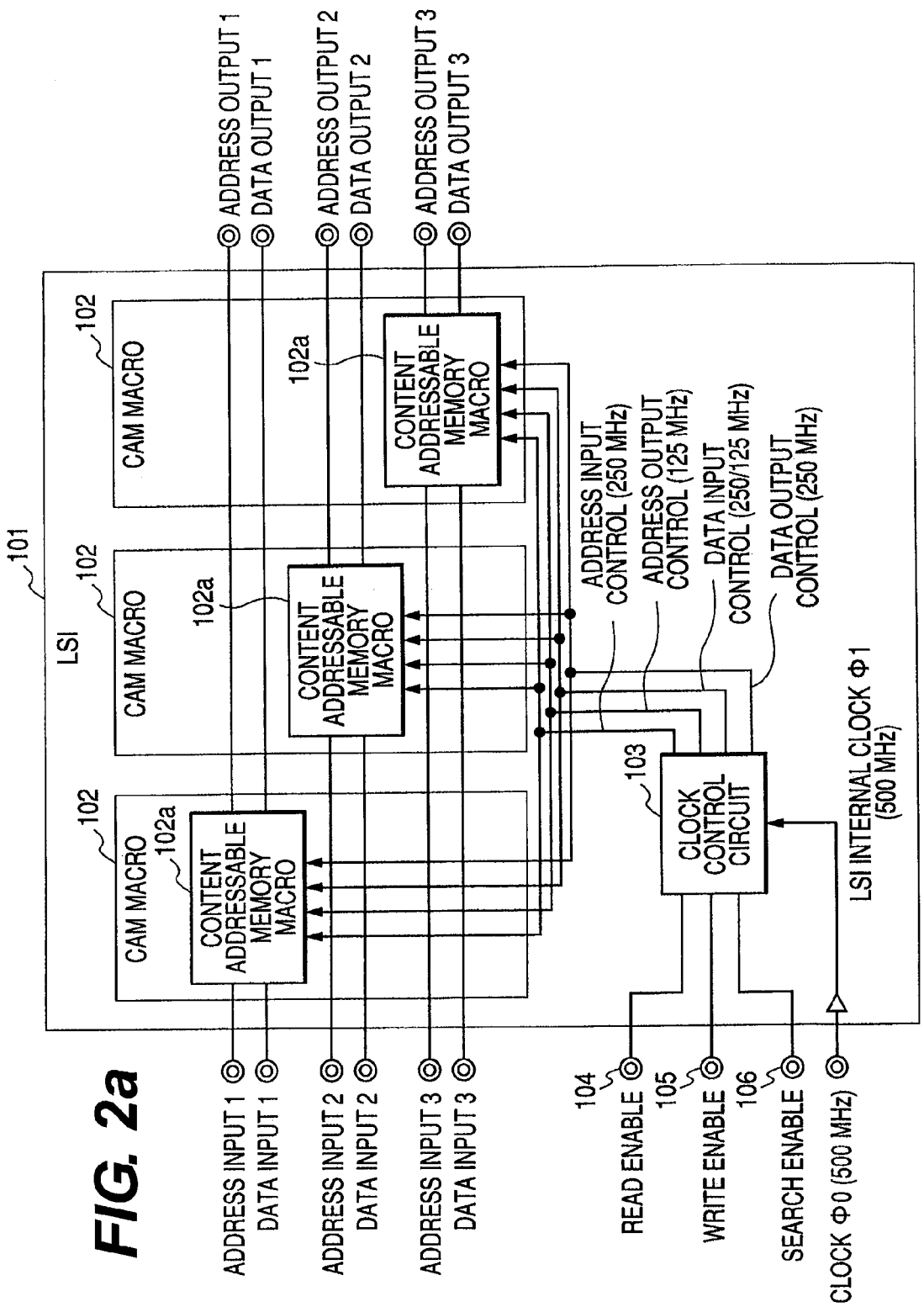

FIG. 2a illustrates a second embodiment. A plurality of CAM macros 102 are placed on a system LSI 101 on which a clock control circuit according to this embodiment is placed. This embodiment is applied to LSIs used for a network whose search bit width is large. The LSIs include, for example, IPv6.

Figure 2B:
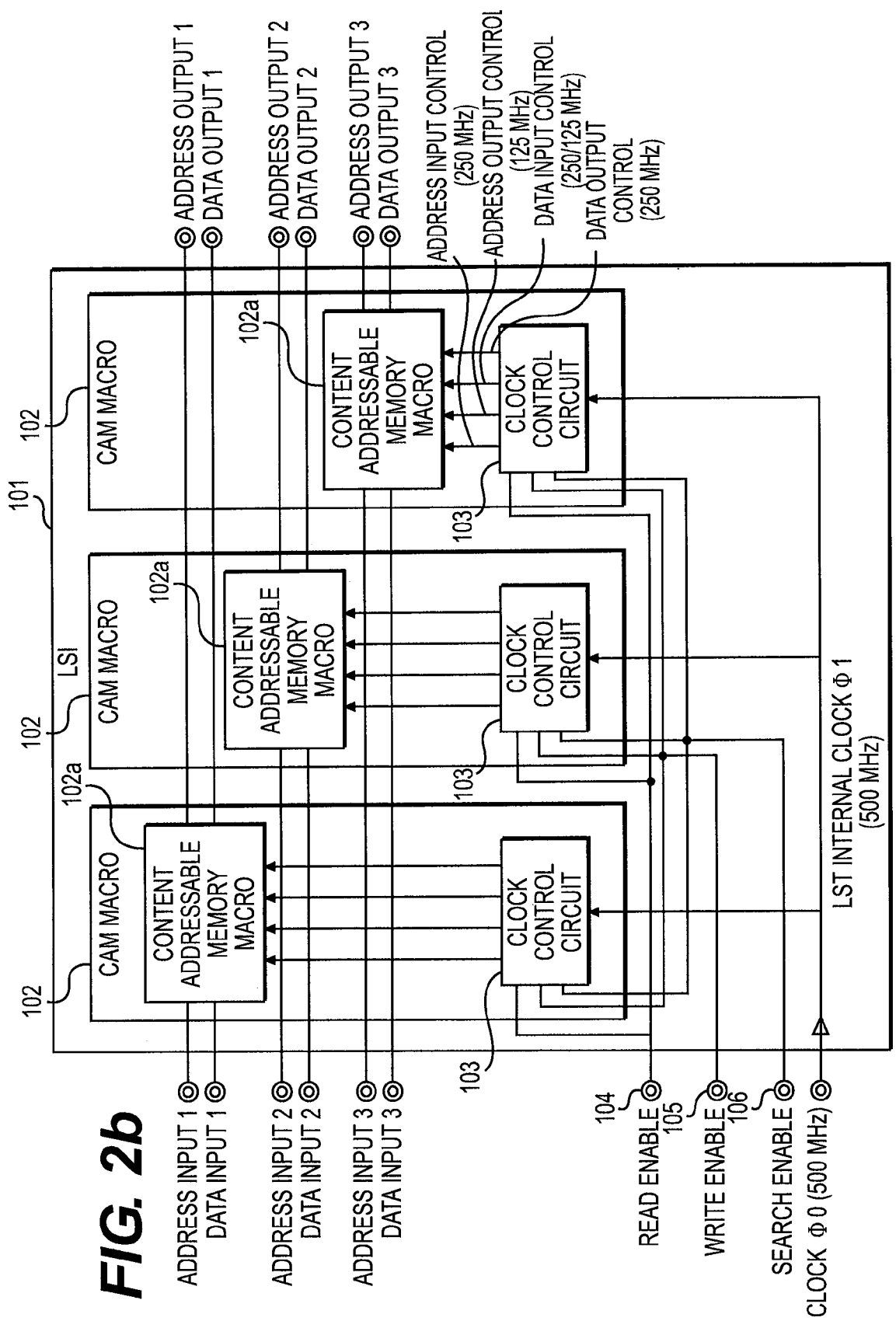

In this case, one clock control circuit 103 is commonly used to control a plurality of CAM macros. This makes it possible to achieve an improvement in throughput, and also to reduce the chip area. FIG. 2b is a variation of the second embodiment in which the clock control circuit 103 is provided on each of the cam macros 102. According to this variation, the clock control circuits 103 can be configured to supply the respective content addressable memory macros 102a with control signals that are different from one another.

In FIG. 2, reference numeral 103 denotes a clock control circuit for controlling a CAM macro 102. The clock control circuit 103 is located on the LSI. With the increase in the number of CAM macros 102 to be controlled, the area efficiency increases. Signals inputted from external pins (clock F0, 104, 105, 106) are connected to the clock control circuit 103. A buffer may also be added between each of the external pins and the clock control circuit 103. The clock control circuit 103 receives signals from the external pins 104, 105, 106 in synchronization with the clock F1 so as to generate a control signal for controlling a content addressable memory macro 102a. An address input control signal, an address output control signal, a data input control signal, and a data output control signal, which are generated, are directed from the clock control circuit 103 to the content addressable memory macro 102a through bus wiring on the LSI. Further, an address input pin, an address output pin, a data input pin, and a data output pin are connected to the content addressable memory macro 102a.

The invention made by the present inventor has been specifically described as above on the basis of the embodiments. However, the present invention is not limited to the above embodiments. As a matter of course, the present invention can be changed in various ways within the range without departing from the gist thereof. For example, how to configure the clock control circuit shown in FIG. 1 is not limited to the configuration shown in FIG. 3. Any configuration may also be used so long as the clock control circuit has the same function.

In addition, it is also possible to adopt a configuration that uses in combination the method according to the first embodiment in which the CAM macro 102 including the built-in clock control circuit is used, and the method according to the second embodiment in which the clock control circuit is located on a chip to control a plurality of content addressable memories. As a result, the present invention can also be applied even in a case where CAM macros whose operating frequencies differ from each other are placed on the same LSI.

In the above description, the invention made by the present inventor has been mainly applied to the semiconductor integrated circuit having the built-in content addressable memory that is included in a field relating to the background on which the present invention is made. However, the present invention is not limited to this. The present invention can also be applied to a semiconductor integrated circuit having other kinds of built-in memories, for example, RAM or ROM.

Incidentally, the reference numerals used in the diagrams of the application concerned will be listed as below.
101 . . . System LSI
102 . . . CAM macro
102a . . . Content addressable memory macro
103 . . . Clock control circuit
104 . . . READ enable signal
105 . . . WRITE enable signal
106 . . . SEARCH enable signal

What is claimed is:
1. A semiconductor integrated circuit comprising,
a memory circuit stem operable at an operating frequency different from a system lock and configured to compare inputted data stored in the memory circuit and to output at least either information about an address or information indicative of the stored data which agree with the inputted data; and a control circuit configured to supply said memory circuit with control signals, wherein an operating frequency of the control signals for write and read operations differs from that for a search operation, and said control circuit is further configured to adjust timings of supplying the respective control signals to said memory circuit, wherein said control circuit includes flip-flop circuits arranged to adjust adjustment widths and timings of outputting the control signals to the memory circuit in synchronism with the system clock.

2. A semiconductor integrated circuit including a content addressable memory which operates at a frequency lower than that of a system clock under which the integrated circuit operates, comprising:

a memory circuit provided with an address input terminal, a data input terminal, an address output terminal, a data output terminal and comparison means, and configured, at a search operation, to compare data inputted from said data input terminal with data stored in a memory cell included in a memory cell array, and outputting, from said address output terminal, information with respect to an address of the stored data which agrees with the data inputted from said data input terminal thereby to constitute the content addressable memory; and a control circuit configured to receive, at said system clock, a read enable signal, a write enable signal and a search enable signal, to generate a plurality of control signals, which include an address input control, a data input control, an address output control and a data output control, and to supply the control signals to said memory circuit at a frequency or frequencies lower than that of said system clock, respectively, so as to control the timing of supplying the address output control to said memory circuit to occur at a timing later than the timing at which the data input control is supplied at the search operation when the search enable signal is applied to the control circuit.

3. The semiconductor integrated circuit according to claim 2, wherein, when the system clock operates at 500 MHz, the operating frequency for said address input control and said data input control at the write and read operations is 250 MHz, and the operating frequency for said address output control at the search operation is 125 MHz.

4. The semiconductor integrated circuit according to claim 2, wherein said control circuit includes flip-flop circuits arranged to adjust setup times and hold times of the control signals for the respective operations of reading, writing and searching.

5. The semiconductor integrated circuit according to claim 2, wherein said control circuit includes a delay circuit for achieving a desired adjustment time.

6. An image processing system according to claim 2, further comprising an image processing logic circuit, wherein the memory circuit is electrically connected to the image processing logic circuit, so as to receive input signals from said input terminals and to output the stored data and the address information to the image processing logic circuit.

7. The semiconductor integrated circuit according to claim 2, comprising a plurality of the memory circuits, which are commonly supplied with said control signals from said control circuits.

8. A semiconductor integrated circuit comprising a plurality of the memory circuits, and the control circuits coupled to the corresponding memory circuits, respectively, as defined in claim 2, which are integrated on a single semiconductor chip.

9. The semiconductor integrated circuit according to claim 8, wherein said memory circuits are supplied by the corresponding control circuits with control signals different from one another.

10. A semiconductor integrated circuit including a memory circuit which operates at a frequency lower than that of a system clock under which the integrated circuit operates, wherein said memory circuit comprises:

a content addressable memory macro provided with an address input terminal, a data input terminal, an address output terminal, and a data output terminal and configured, at a search operation, to compare data stored in the content addressable memory macro with data inputted from the address output terminal, and to output from the address output terminal, information with respect to an address at which the data corresponding to the inputted data is stored in the memory macro; and a control circuit configured to receive, at said system clock, a read enable signal, a write enable signal and a search enable signal, to generate a plurality of control signals, which include an address input control signal, a data input control, an address output control and a data output control, and to supply the control signals to said memory macro at a frequency or frequencies lower than that of said system clock, respectively, so as to control the timing of supplying the address output control to said memory macro to occur at a timing later than the timing at which the data input control is supplied at the search operation when the search enable signal is applied to the control circuit.

* * * * *